United States Patent [19]
Nagai et al.

[11] Patent Number: 5,932,362
[45] Date of Patent: Aug. 3, 1999

[54] ORGANIC ELECTROLUMINESCENT ELEMENT

[75] Inventors: Kazukiyo Nagai; Chihaya Adachi; Nozomu Tamoto; Yohta Sakon, all of Numazu, Japan

[73] Assignee: Ricoh Company, Ltd., Tokyo, Japan

[21] Appl. No.: 08/925,147

[22] Filed: Sep. 8, 1997

Related U.S. Application Data

[62] Division of application No. 08/515,006, Aug. 14, 1995, Pat. No. 5,702,833.

[30] Foreign Application Priority Data

Mar. 8, 1995 [JP] Japan ................................. 7-074715

[51] Int. Cl.$^6$ ........................................... H05B 33/14
[52] U.S. Cl. ..................... 428/690; 428/917; 313/503; 313/504; 313/506
[58] Field of Search ........................ 428/690, 917; 313/503, 504, 506

[56] References Cited

U.S. PATENT DOCUMENTS 5,382,477  1/1995  Saito et al. .................... 428/690

FOREIGN PATENT DOCUMENTS 7179394  7/1995  Japan .

*Primary Examiner*—Charles Nold
*Attorney, Agent, or Firm*—Oblon, Spivak, McClelland, Maier & Neustadt, P.C.

[57] ABSTRACT

An organic electroluminescent element having an anode, a cathode, and an organic compound layer provided between the electrodes, the organic compound layer containing an oxadiazole compound of formula (I) or (II):

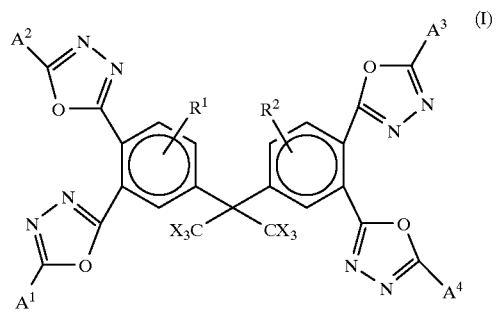

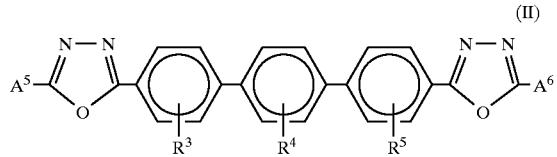

wherein $A^1$ to $A^6$ are each an aromatic hydrocarbon group or an aromatic heterocyclic group which may have a substituent; X is a hydrogen atom or a fluorine atom; $R^1$ and $R^2$ are each a hydrogen atom, a halogen atom, or an alkyl group which may have a substituent, or an alkoxyl group which may have a substituent; and $R^3$, $R^4$ and $R^5$ are each a hydrogen atom, a halogen atom, an alkyl group which may have a substituent, an alkoxyl group which may have a substituent, or hydroxyl group.

2 Claims, 5 Drawing Sheets

F I G. 1
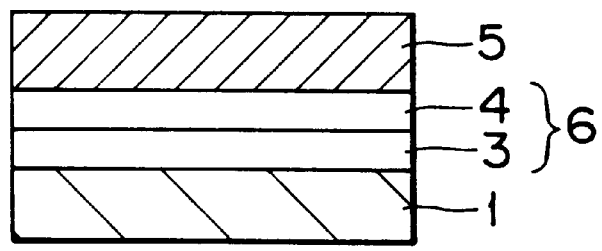
F I G. 2
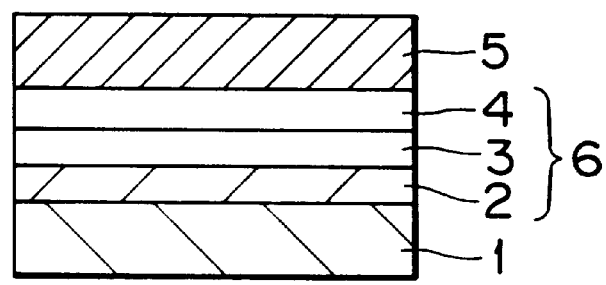
F I G. 3
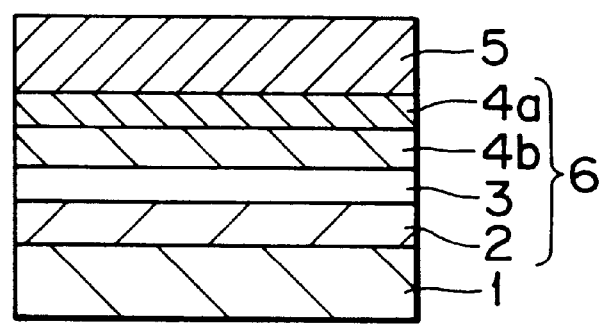

ORGANIC ELECTROLUMINESCENT ELEMENT

This is a division of application Ser. No. 08/515,006 filed on Aug. 14, 1995 U.S. Pat. No. 5,702,833.

BACKGROUND OF THE INVENTION

1. Field of the Invention

The present invention relates to an organic electroluminescent element (hereinafter referred to as an organic EL element) capable of inducing luminescence by the recombination of an electron and a hole when they are injected into an organic compound layer of the EL element.

2. Discussion of Background

In recent years, in line with the trend toward diversification of information processing equipment and space-saving for location of such equipment, there is an increasing demand for a plans display element which can be operated with a low electric power and occupies a small space as compared with the cathode ray tube (CRT) display. A liquid crystal has been already proposed as such a plane display element, but much attention has been paid to an organic EL element of a self-emitting type because the EL element can indicate the information clearly and can be driven with a direct-current low voltage system.

A luminescent layer of the organic EL element is of a single-layered type, or a laminated type which comprises a carrier transporting layer and a luminescent layer. The luminance of the laminated luminescent layer is higher than that of the single-layered one. The above-mentioned carrier transporting layer for use in the laminated luminescent layer serves to transport a hole or an electron.

A variety of triphenylamine compounds, which have been developed for an organic electrophotographic photoconductor, are proved to be usable as materials for transporting the hole (hereinafter referred to as hole transporting materials) Some of them are found to have relatively high thermal stability in the amorphous condition.

On the other hand, some of oxadiazole compounds, triazole compounds and peryleneimide compounds are know as electron-transporting materials, but there are few compounds that have no absorption in the visible region. Further, the electron-transporting materials with high thermal stability are very rare among the above-mentioned compounds.

From the viewpoint of the layer structure of the EL element, the organic EL element comprising an electron-transporting layer has the advantages that various hole transporting materials can be selected for a luminescent layer, an exciton can be trapped in the small luminescent layer, and the deactivation of the exciton caused by the mutual action between the exciton and a cathode can be prevented. Thus, the organic EL element with a high luminance can be obtained using a variety of luminescent materials with different fluorescent colors. However, because the conventional electron-transporting materials do not have high stability, the durability of the conventional EL element comprising the electron-transporting layer is regarded as poor.

For instance, there is known an organic EL element using an oxadiazole compound as a luminescent material and electron-transporting material, as stated in "Nippon Kagaku Kaishi 1991, (11), pages 1540–1548". However, the problem of the film stability of the above-mentioned oxadiazole compound for use in the EL element remains unsolved, so that there is no organic EL element that shows high luminance and high reliability at the present stage.

It is considered that the poor film stability of the oxadiazole compound results from the crystallization thereof Some of the conventional oxadiazole compounds cannot be made into an amorphous film, and others can be formed into an amorphous film, but the amorphous film thus formed induces crystallization during a long period of storage. Therefore, there is an increasing demand for an organic EL element employing an electron-transporting material which has good film-forming properties and does not easily induce crystallization.

SUMMARY OF THE INVENTION

Accordingly, an object of the present invention is to provide an organic EL element with high durability which is provided with the electron-transporting properties.

The above-mentioned object of the present invention is achieved by an organic EL element comprising an anode, a cathode, and an organic compound layer provided between the anode and the cathode, the organic compound layer comprising an oxadiazole compound of formula (I) in an effective amount:

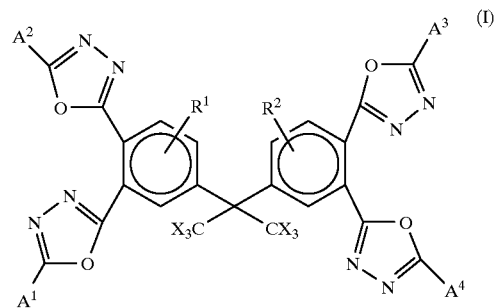

wherein $A^1$ to $A^4$ are each independently an aromatic hydrocarbon group which may have a substituent or an aromatic heterocyclic group which may have a substituent; X is a hydrogen atom or a fluorine atom; and $R^1$ and $R^2$ are each independently a hydrogen atom, a halogen atom, or an alkyl group having 1 to 12 carbon atoms which may have a substituent or an alkoxy group having 1 to 12 carbon atoms which may have a substituent.

In the oxadiazole compound of formula (I), it is preferable that X represent a fluorine atom.

Alternatively, the previously mentioned object of the present invention is also achieved by an organic EL element comprising an anode, a cathode, and an organic compound layer provided between the anode and the cathode, the organic compound layer comprising an oxadiazole compound of formula (II) in an effective amount:

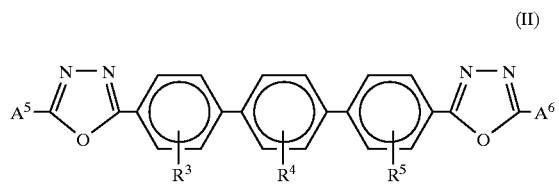

wherein $A^5$ and $A^6$ are each independently an aromatic hydrocarbon group which may have a substituent, or an aromatic heterocyclic group which may have a substituent; and $R^3$, $R^4$ and $R^5$ are each independently a hydrogen atom,, a halogen atom, an alkyl group having 1 to 12 carbon atoms which may have a substituent, an alkoxyl group having 1 to 12 carbon atoms which may have a substituent, or hydroxyl group.

In each of the aforementioned organic EL elements it is preferable that the organic compound layer comprise a plurality of overlaid organic compound sub-layers which comprise a luminescent layer, and at least one electron-transporting layer comprising the oxadiazole compound of formula (I) or (II) which is provided between the luminescent layer and the cathode.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein:

FIGS. 1 through 6 are schematic cross-sectional views in explanation of the structure of an organic EL element according to the present invention;

DESCRIPTION OF THE PREFERRED EMBODIMENTS

Figure 4:
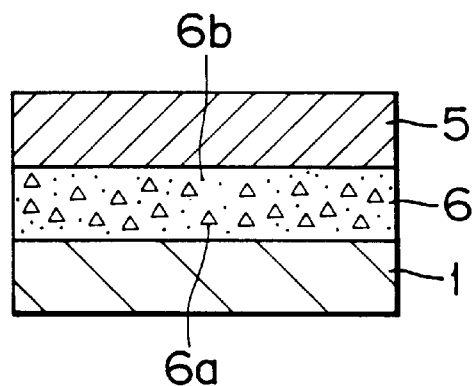

An organic EL element according to the present invention comprises an anode, a cathode, and an organic compound layer provided between the anode and the cathode, the organic compound layer comprising an oxadiazole compound of formula (I) in an effective amount:

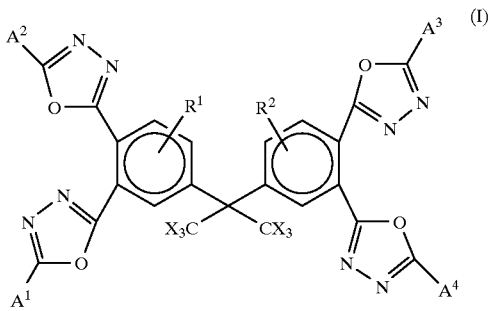

wherein $A^1$ to $A^4$ are each independently an aromatic hydrocarbon group which may have a substituent, or an aromatic heterocyclic group which may have a substituent, X is a hydrogen atom or a fluorine atom; and $R^1$ and $R^2$ are each independently a hydrogen atom, a halogen atom, or an alkyl group having 1 to 12 carbon atoms which may have a substituent, or an alkoxyl group having 1 to 12 carbon atoms which may have a substituent.

In the formula (I), specific examples of the aromatic hydrocarbon group or aromatic heterocyclic group represented by $A^1$ to $A^4$ are styryl group, phenyl group, biphenylyl group, terphenylyl group, naphthyl group, anthryl group, acenaphthenyl group, fluorenyl group, phenanthryl group, indenyl group, pyrenyl group, pyridyl group, pyrimidyl group, furanyl group, pyrrolyl group, thiophenyl group, quinolyl group, benzofuranyl group, benzothiophenyl group, indolyl group, carbazolyl group, benzoxazolyl group, quinoxalyl group, benzoimidazolyl group, pyrazolyl group, dibenzofuranyl group, dibenzothiophenyl group, oxazolyl group, and oxadiazolyl group.

The above-mentioned aromatic hydrocarbon group or aromatic heterocyclic group may have at least one substituent selected from the group consisting of a halogen atoms hydroxyl group, cyano group, nitro group, amino group, trifluoromethyl group an alkyl group having 1 to 12 carbon atoms, preferably 1 to 6 carbon atoms an alkoxyl group having 1 to 12 carbon atoms, preferably 1 to 6 carbon atoms an aryloxy group phenyl group styryl group, naphthyl group, thiophenyl group, an aralkyl group, biphenylyl group, bithiophenyl group, furanyl group, bifuranyl group, pyrrolyl group, and bipyrrolyl group.

The oxadiazole compound of formula (I) is easily soluble in organic solvents for general use and compatible with conventional thermoplastic polymers within a wide concentration range, thereby forming a uniform film. The stability of the film thus obtained is excellent. Therefore, the durability of the organic EL element can be improved even when a luminescent layer of a single-layered type is prepared by dispersing a hole-transporting material, a luminescent material and the oxadiazole compound of formula (I) in the thermoplastic polymer. In addition, in the case where a slight amount of the luminescent material is added to the oxadiazole compound of formula (I) to prepare a luminescent layer of the organic EL element, the layer made from the oxadiazole compound of formula (I) can become amorphous and shows a high glass transition temperature. Therefore, the luminescent material can be uniformly dispersed in the obtained luminescent layer, and the EL element with high durability can be obtained.

Furthermore, when the organic EL element of the present invention comprises an electron-transporting layer which consists of, or comprises the above-mentioned oxadiazole compound of formula (I), the luminance and the durability of the obtained EL element are further improved. To be more specific, it is preferable that the EL element of the present invention comprise a plurality of organic compound layers including a luminescent layer which are provided between the anode and the cathode and at least one electron-transporting layer consisting of, or comprising the oxadiazole compound of formula (I) be interposed between the luminescent layer and the cathode.

When X represents a fluorine atom in the oxadiazole compound of formula (I), the durability of the obtained organic EL element can be further improved. The reason for this is that the intermolecular rotation is hindered in three dimensions at the center of a molecule of the compound of formula (I) so that the rigidity of the molecule is increased. As a result, the glass transition temperature of the compound is increased, which leads to the improvement in thermal stability of a film of the compound of formula (I).

Alternatively, according to the present invention, there is provided an organic EL element comprising an anode, a cathode, and an organic compound layer provided between the anode and the cathode, the organic compound layer comprising an oxadiazole compound of formula (II) in an effective amount:

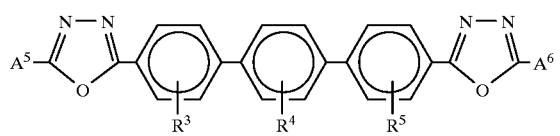
(II)

wherein $A^5$ and $A^6$ are each independently an aromatic hydrocarbon group which may have a substituent, or an aromatic heterocyclic group which may have a substituent; and $R^3$, $R^4$ and $R^5$ are each independently a hydrogen atom, a halogen atom, an alkyl group having 1 to 12 carbon atoms which may have a substituent, an alkoxyl group having 1 to 12 carbon atoms which may have a substituent, or hydroxyl group.

In the formula (II), specific examples of the aromatic hydrocarbon group or aromatic heterocyclic group represented by $A^5$ and $A^6$ are styryl group, phenyl group, biphenylyl group, terphenylyl group, naphthyl group, anthryl group, acenaphthenyl group, fluorenyl group, phenanthryl group, indenyl group, pyrenyl group, pyridyl group, pyrimidyl group, furanyl group, pyrrolyl group, thiophenyl group, quinolyl group, benzofuranyl group, benzothiophenyl group, indolyl group, carbazolyl group, benzoxazolyl group, quinoxalyl group, benzoimidasolyl group, pyrazolyl group, dibenzofuranyl group, dibenzothiophenyl group, oxazolyl group, and oxadiazolyl group.

The above-mentioned aromatic hydrocarbon group or aromatic heterocyclic group may have at least one substituent selected from the group consisting of a halogen atom, hydroxyl group, cyano group, nitro group, amino group, trifluoromethyl group, an alkyl group having 1 to 12 carbon atoms, preferably 1 to 6 carbon atoms, an alkoxyl group having 1 to 12 carbon atoms, preferably 1 to 6 carbon atoms, an aryloxy group, phenyl group, styryl group, naphthyl group, thiophenyl group, an aralkyl group, biphenylyl group, bithiophenyl group, furanyl group, bifuranyl group, pyrrolyl group, and bipyrrolyl group.

In the formula (II) the alkyl group represented by $R^3$, $R^4$ and $R^5$ has 1 to 12 carbon atoms, preferably 1 to 6 carbon atoms, which may have a substituent selected from the group consisting of a halogen atom, hydroxyl group, phenyl group, an alkoxyl group and amino group. The alkoxyl group represented by $R^3$, $R^4$ and $R^5$ has 1 to 12 carbon atoms, preferably 1 to 6 carbon atoms, which may have a substituent selected from the group consisting of a halogen atoms hydroxyl group and amino group.

Although the solubilities of the oxadiazole compound of formula (II) in organic solvents for general use are low, the oxadiazole compound of formula (II) can be easily made into a uniform transparent film by a conventional film-forming method such as vacuum-deposition. It is confirmed by the observation with an electron microscope that the film of the oxadiazole compound of formula (II) is a fine microcrstalline one. The uniform transparent film thus obtained can be maintained for one year or more even though allowed to stand in contact with the atmosphere at room temperature. The film of the oxadiazole compound of formula (II) can be proved to have high stability. Therefore, when the organic EL element of the present invention comprises at least one electron-transporting layer consisting of, or comprising the oxadiazole compound of formula (II) which is interposed between the luminescent layer and the cathode, the durability of the EL element is further improved and the luminance is upgraded.

Specific examples of the previously mentioned oxadiazole compounds of formulae (I) and (II) for use in the organic EL element of the present invention are respectively shown in the following Tables 1 and 2:

TABLE 1

(I)

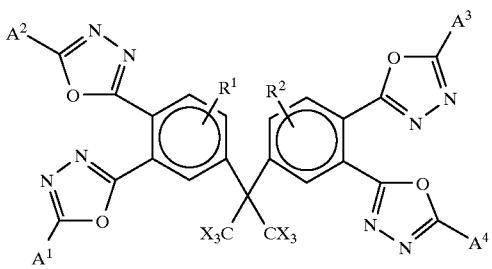

| No. | $A^1$–$A^4$ | $R^1$–$R^2$ | X |
|---|---|---|---|
| 1 | ⌬ | H | H |
| 2 | H₃C—⌬ | H | H |
| 3 | H₃CO—⌬ | H | H |
| 4 | ⌬—⌬ | H | H |
| 5 | C₂H₅—⌬—⌬ | H | H |
| 6 | (C₂H₅)₂N—⌬ | H | H |
| 7 | (naphthyl) | H | H |
| 8 | (naphthyl) | H | H |

TABLE 1-continued (I)

[Structure: two phenyl rings each bearing two oxadiazole substituents (with A¹, A², A³, A⁴), connected by C(CX₃)₂ bridge, with R¹ and R² on the rings]

| No. | A¹–A⁴ | R¹–R² | X |
|---|---|---|---|
| 9 | 2-thienyl | H | H |
| 10 | 4-pyridyl | H | H |
| 11 | phenyl | H | F |
| 12 | 4-methylphenyl (H₃C–C₆H₄–) | H | F |
| 13 | 4-methoxyphenyl (H₃CO–C₆H₄–) | H | F |
| 14 | biphenyl | H | F |
| 15 | 4'-ethylbiphenyl (C₂H₅–C₆H₄–C₆H₄–) | H | F |
| 16 | 4-(diethylamino)phenyl ((C₂H₅)₂N–C₆H₄–) | H | F |
| 17 | 1-naphthyl | H | F |
| 18 | 2-naphthyl | H | F |

TABLE 1-continued (I)

| No. | A¹–A⁴ | R¹–R² | X |
|---|---|---|---|
| 19 | 2-thienyl | H | F |
| 20 | 4-pyridyl | H | F |

TABLE 2

(II)

$$A^5\text{—oxadiazole—}C_6H_3(R^3)\text{—}C_6H_3(R^4)\text{—}C_6H_3(R^5)\text{—oxadiazole—}A^6$$

($R^3$, $R^4$ and $R^5$ are each hydrogen atom)

| No. | A⁵–A⁶ |
|---|---|
| 21 | phenyl |
| 22 | 4-methylphenyl (–C₆H₄–CH₃) |
| 23 | 3-methylphenyl |
| 24 | 2-methylphenyl (H₃C–C₆H₄–) |
| 25 | 4-cyanophenyl (–C₆H₄–CN) |

TABLE 2-continued
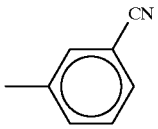
(R³, R⁴ and R⁵ are each hydrogen atom)
| No. | A⁵–A⁶ |
|---|---|
| 26 | 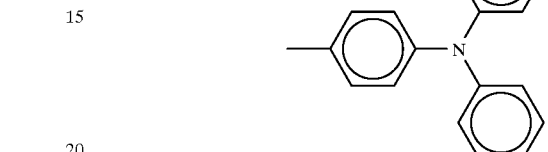 |
| 27 | 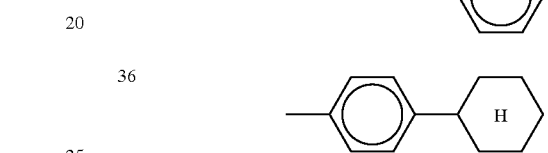 |
| 28 |  |
| 29 | 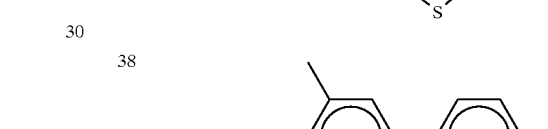 |
| 30 | 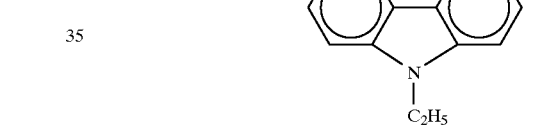 |
| 31 | 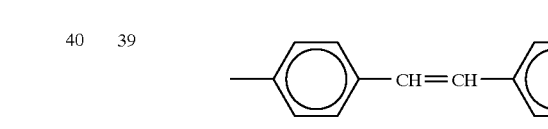 |
| 32 | 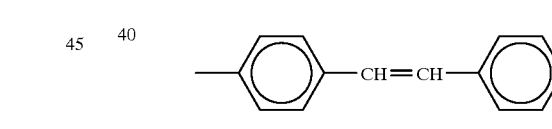 |
| 33 |  |
| 34 | 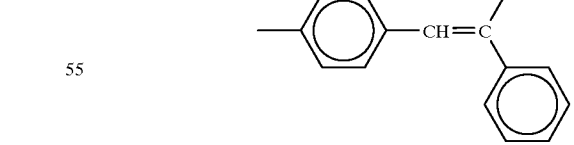 |
TABLE 2-continued
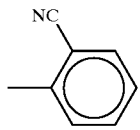
(R³, R⁴ and R⁵ are each hydrogen atom)
| No. | A⁵–A⁶ |
|---|---|
| 35 | 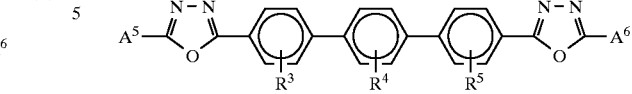 |
| 36 | |
| 37 | |
| 38 | |
| 39 | |
| 40 | |
| 41 | 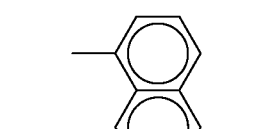 |
| 42 |  |

TABLE 2-continued (II)

$A^5$ and $A^6$ attached to 1,3,4-oxadiazole rings linked via terphenyl with substituents $R^3$, $R^4$, $R^5$ ($R^3$, $R^4$ and $R^5$ are each hydrogen atom)

| No. | $A^5$–$A^6$ |
|---|---|
| 43 | 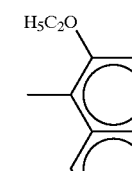 (1-ethoxy-naphthyl with methyl) |
| 44 | 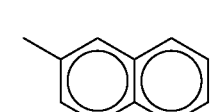 (methylnaphthyl) |
| 45 | 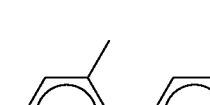 (2-methylbiphenyl) |
| 46 |  (biphenyl) |
| 47 |  (4'-ethylbiphenyl, $C_2H_5$) |
| 48 |  (4'-n-propylbiphenyl, n—$C_3H_7$) |
| 49 | 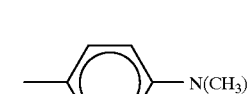 (4-$N(CH_3)_2$-phenyl) |
| 50 | 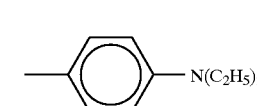 (4-$N(C_2H_5)_2$-phenyl) |
| 51 | 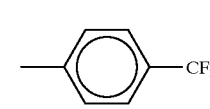 (4-$CF_3$-phenyl) |
| 52 |  (3-$CF_3$-phenyl) |
| 53 | (2-$CF_3$-phenyl, $F_3C$) |
| 54 | (4-pyridyl) |
| 55 | (3-pyridyl) |
| 56 | (2-pyridyl) |
| 57 | (pyrenyl) |
| 58 | (phenanthryl) |
| 59 | (fluoronaphthyl, F) |
| 60 | (quinolyl, N) |

TABLE 2-continued

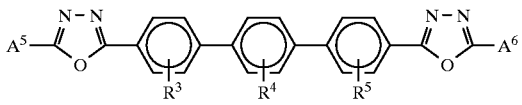

(R³, R⁴ and R⁵ are each hydrogen atom)

| No. | A⁵–A⁶ |
|---|---|
| 61 | 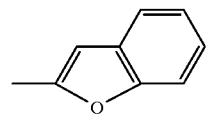 |
| 62 | 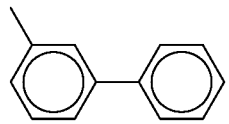 |
| 63 | 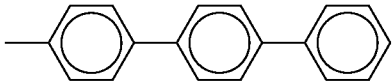 |
| 64 | 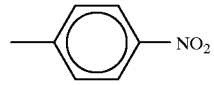 |
| 65 | 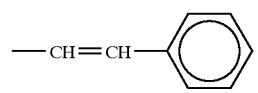 |
| 66 | 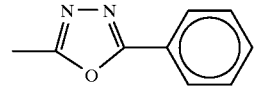 |
| 67 | 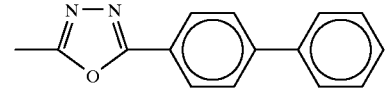 |
| 68 | 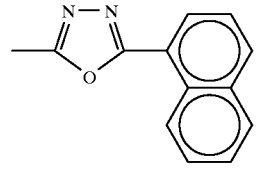 |
| 69 | 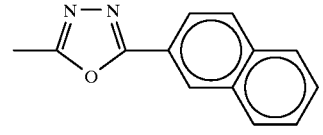 |
| 70 | 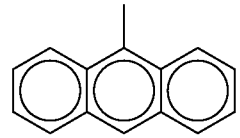 |

TABLE 2-continued

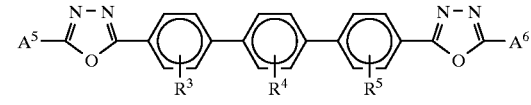

(R³, R⁴ and R⁵ are each hydrogen atom)

| No. | A⁵–A⁶ |
|---|---|
| 71 | 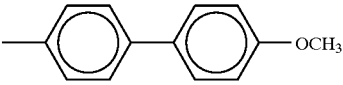 |
| 72 | 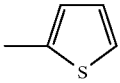 |
| 73 | 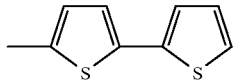 |
| 74 | 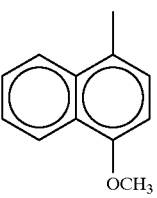 |

To prepare the organic EL element of the present invention, for example, the previously mentioned oxadiazole compound of formula (I) or (II) is made into a thin film by vacuum deposition or solution coating method, and the thus obtained layer is interposed between the anode and the cathode. The oxadiazole compound of formula (I) or (II) may be used alone or in combination with other organic compounds in the formation of a thin layer. Further, other functional layers may be provided between the anode and the cathode.

FIG. 1 through FIG. 6 are schematic cross-sectional views, each of which shows the structure of the organic EL element according to the present invention An organic EL element as shown in FIG. 1 comprises an organic compound layer 6 of a laminated type, which is interposed between an anode 1 and a cathode 5. The organic compound layer 6 comprises a luminescent layer 3 and an electron-transporting layer 4, which are overlaid on the anode 1 in this order. The electron-transporting layer 4 comprises the oxadiazole compound of formula (I)

An organic EL element as shown in FIG. 2 comprises an organic compound layer 6 of a laminated type, which is interposed between an anode 1 and a cathode 5. The organic compound layer 6 comprises a hole-transporting layer 2, a luminescent layer 3, and an electron-transporting layer 4, which are overlaid on the anode 1 in this order. The electron-transporting layer 4 comprises the oxadiazole compound of formula (I) or (II).

The structure of an organic EL element as shown in FIG. 3 is the same as that of the organic EL element shown in FIG. 2 except that the single-layered electron-transporting layer 4 for use in the EL element of FIG. 2 is changed to a two-layered electron-transporting layer comprising a first electron-transporting layer 4a and a second electron-transporting layer 4b. In this case, the second electron-transporting layer 4b comprises the oxadiazole compound of formula (I) or (II). The oxadiazole compound of formula (I) or (II) may be used alone or in combination with other electron-transporting materials in the second electron-transporting layer 4b.

An organic EL element as shown in FIG. 4 comprises a single-layered organic compound layer 6 which is provided between an anode 1 and a cathode 5. When the organic compound layer 6 comprises a matrix resin with hole-transporting properties, such as polyvinyl carbazole, a luminescent material 6a, and an electron-transporting material 6b comprising the oxadiazole compound of formula (I) or (II) may be dispersed in the matrix resin, as shown in FIG. 4. On the other hand, in the case where the matrix resin for use in the organic compound layer 6 has no hole-transporting properties, a hole-transporting material may be contained in the organic compound layer 6.

Figure 5:
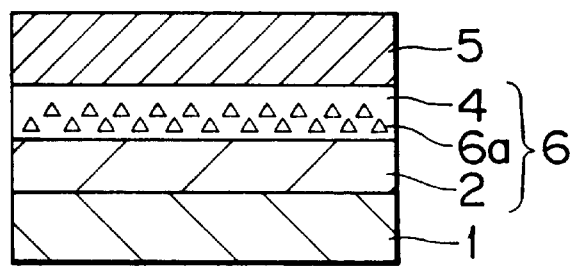

An organic EL element as shown in FIG. 5 comprises an organic compound layer 6 of a laminated type which is provided between an anode 1 and a cathode 5. The organic compound layer 6 comprises a hole-transporting layer 2 and an electron-transporting layer 4 which are overlaid on the anode 1 in this order. The electron-transporting layer 4 of the EL element as shown in FIG. 5 can be prepared by, for example, adding a small amount of a luminescent material 6a to the oxadiazole compound of formula (I) or (II) serving as the electron-transporting material, and forming the mixture into a thin film.

Figure 6:
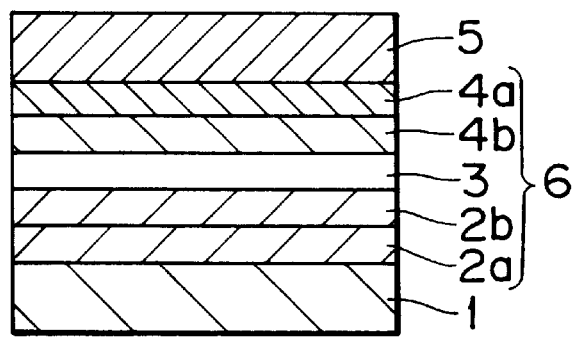

An organic EL element as shown in FIG. 6 comprises an organic compound layer 6 of a laminated type which is provided between an anode 1 and a cathode 5. There are overlaid a first hole-transporting layer 2a, a second hole-transporting layer 2b, a luminescent layer 3, a second electron-transporting layer 4b and a first electron-transporting layer 4a on the anode 1 in this order. In this case, the second electron-transporting layer 4b comprises the oxadiazole compound of formula (I) or (II). The oxadiazole compound of formula (I) or (II) may be used alone or in combination with other electron transporting materials in the second electron-transporting layer 4b.

When the organic EL element of the present invention comprises an organic compound layer of a single-layered type as shown in FIG. 4, it is preferable that the organic compound layer comprise (i) a polymer which has neither carrier transporting properties nor luminescent properties in itself, and (ii) compounds capable of imparting various functions to the layers which are dispersed in a monomolecular condition in the polymer, as stated in, for example, "Appl. Phys. Lett., 61 (1992) 761", "Mol. Cryst. Liq. Cryst., 227 (1993) 277", and "OYO BUTURI 61 (1992) 1044". This kind of single-layered organic compound layer will also be referred to as an organic compound layer of a polymer dispersed type.

In the EL element as shown in FIG. 4, the oxadiazole compound of formula (I) or (II), namely, the electron-transporting material 6b is employed in the organic compound layer 6 in order to control the carrier transporting properties of the organic compound layer 6 which works as a luminescent layer. Such a single-layered organic compound layer 6 can be obtained by, for examples dispersing a conventional hole-transporting low-molecular materials a luminescent material with strong fluorescence, and the oxadiazole compound of formula (I) or (II) capable of providing the electron-transporting properties in a polymer such as poly(methyl methacrylate) or bisphenol A polycarbonate which has no carrier transporting properties in itself, but is soluble in a solvent, with the amount ratios being properly adjusted. Thus, the organic EL element comprising the single-layered organic compound layer of a polymer dispersed type can be obtained.

Alternatively, the luminescent material and the oxadiazole compound of formula (I) or (II) may be dispersed in a polymer having hole-transporting properties, such as polyvinyl carbazole, with the amount ratios being properly adjusted, so that the single-layered organic compound layer can be prepared as shown in FIG. 4.

A coating liquid for the above-mentioned organic compound layer of a polymer dispersed type is prepared by dissolving each material in a proper organic solvent, and a thin film can be formed by dip coating or spin coating of the above prepared coating liquid.

Conventionally, 2-(4-biphenylyl)-5-(4-tertbutylphenyl)-1,3,4-oxadiazole (hereinafter referred to as PBD) and tris (8-hydroxyquinolinato) aluminum (hereinafter referred to as Alq) are used as the materials for providing the electron-transporting properties to the above-mentioned organic compound layer of a polymer dispersed type. However, when the PBD is dispersed in the layer at a high concentration, crystallization takes place with time, thereby causing the EL element to deteriorate. The Alq has the drawback that it cannot be used for the preparation of an EL element capable of emitting a blue light because the wavelength of the blue light is shorter than the emission spectrum of the Alq.

Those problems of the conventional organic compound layer of a polymer dispersed type can be solved by employing the oxadiazole compound of formula (I) or (II) in the organic compound layer of a polymer dispersed type of the organic EL element according to the present invention. In particulars the organic EL element comprising the oxadiazole compound of formula (I) has the advantages that the concentration of the oxadiazole compound of formula (I) is not limited, and the concentration of a polymer employed can be minimized depending upon the combination of the oxadiazole compound of formula (I) and a conventional hole-transporting material which is soluble in a solvent and stable in its amorphous condition. Therefore, a driving voltage for the EL element can be lowered and the durability of the obtained EL element can be improved.

In the organic compound layer of a polymer dispersed type, the carrier mobility depends on the concentrations of the hole-transporting materials and the electron-transporting materials to be employed. It is known that the higher the concentrations of these carrier transporting materials, the higher the transporting properties. From the above-mentioned theory the EL element of the present invention can be driven by a low voltage, so that the durability of the element can be improved. Even when the organic compound layer of a polymer dispersed type is prepared using a polymer at a concentration of less than 30 wt. % of the total weight of the organic compound layer, the obtained layer can work as a luminescent layer sufficiently. In this case, the amount of the luminescent material may be in a range of 0.1 to 10 wt. %, and the amount of the electron-transporting material may be determined with the balance of the electron-transporting properties and the hole-transporting properties taken into consideration.

To be more specific, a mixture of a hole transporting material, HTM-1 to be described later, in an amount ranging from 10 to 45 wt. %, the previously mentioned electron-transporting material No. 1, as shown in Table 1, in an amount ranging from 80 to 20 wt. %, 3-(2'-benzothiazolyl)-7-diethylaminocoumarin (Coumarin 6) serving as a luminescent material in an amount of 1 wt. %, and bisphenol A polycarbonate resin in the balance amount is dissolved in 1,2-dichloroethane to prepare a coating liquid. The coating liquid thus prepared is coated on an ITO support member serving as an anode by dipping so that a layer with a thickness of 30 to 200 nm may be provided on the ITO anode. Thereafter, a cathode may be provided on the above prepared layer by vacuum deposition, so that an organic EL element of the present invention can be obtained.

Examples of the material for the anode for use in the EL element include metals such as nickel, gold, platinum and palladium, and alloys thereof; metals with a large work function such as tin oxide ($SnO_2$), indium-tin-oxide (ITO), zinc oxide ($ZnO_2$) doped with an acceptor impurity and copper iodide, and alloys and compounds thereof; and electroconductive polymers such as poly(3-methylthiophene) and polypyrrole.

Examples of the material for the cathode for use in the EL element include metals with a small work function such as silver, tin, lead, magnesium, manganese, aluminum, lithium, calcium and strontium, and alloys thereof; and semiconductors such as n-type silicon based semiconductor, germanium based semiconductor, and zinc oxide doped with a donor impurity.

When the organic EL element of the present invention is used as a plane light emitting device, it is desirable that at least one of the anode or the cathode be sufficiently transparent, to be more specific, exhibit a light transmittance of 80% or more, within the wave range of the EL element employed. Therefore, a glass or plastic transparent plate may be used as a support member for at least one electrode. In this case, there can be provided between the above-mentioned transparent support member and the electrode a variety of layers, such as a layer capable of improving the smoothness of the support member, a layer capable of preventing the ion scattering from the support member, a layer capable of absorbing ultraviolet light to prevent the ultraviolet light from entering the organic compound layer, or an interference filter layer. In addition, there may be provided an ultraviolet screening layer or a reflection preventing layer on the back side of the above-mentioned transparent support member, opposite to the electrode with respect to the support member. Further, the transparent support member may be surface-treated to have minute surface-roughness to diffuse the light, and a color filter and an interference filter may be overlaid.

To improve the stability of the EL element, especially to protect the EL element from moisture in the atmosphere, a protective layer may be provided on the EL element, the EL element may be put into a cell with a silicone oil loaded therein, or the EL element may be sealed into a vacuum cell. In the case where the protective layer is employed, a protective layer may be provided on the back side of the cathode, opposite to the organic compound layers with respect to the cathode, and the edge side of the EL element, by deposition of a metallic oxide such as germanium oxide. Alternatively, a polymer layer may also be used as the protective layer.

In the present invention, the following conventional hole-transporting materials (hereinafter referred to as HTM) can be employed in the organic EL element of the present invention:

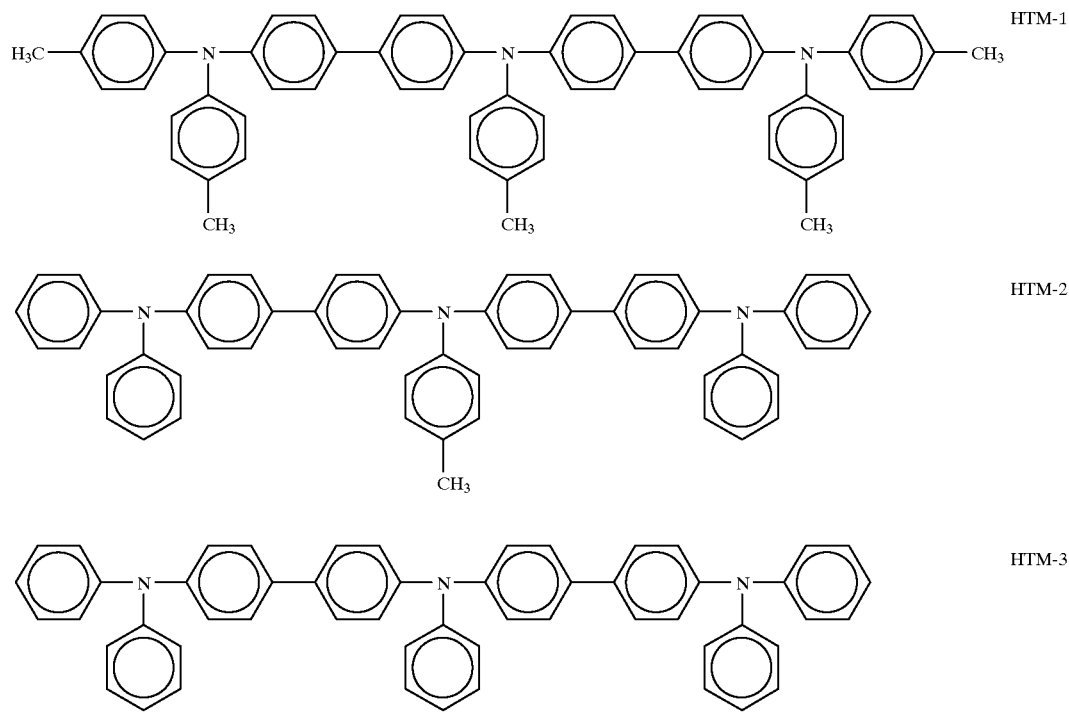

-continued
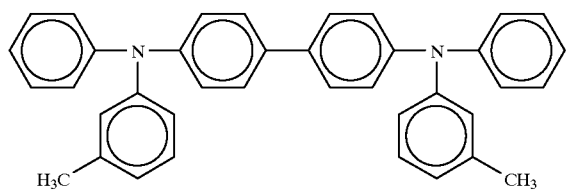
HTM-4
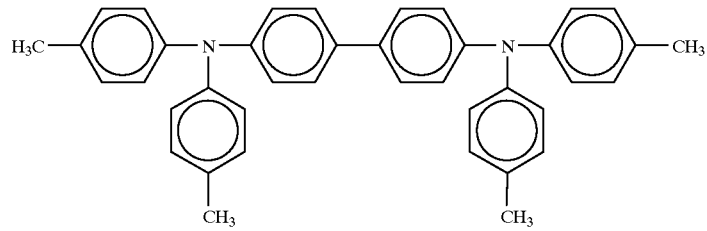
HTM-5
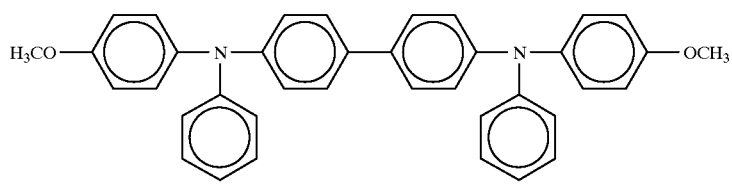
HTM-6
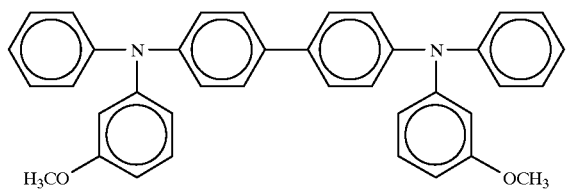
HTM-7
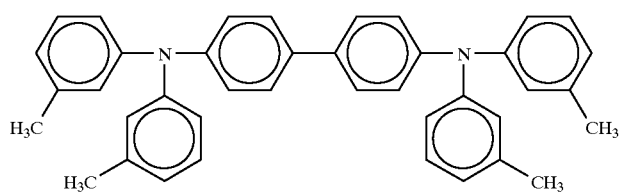
HTM-8
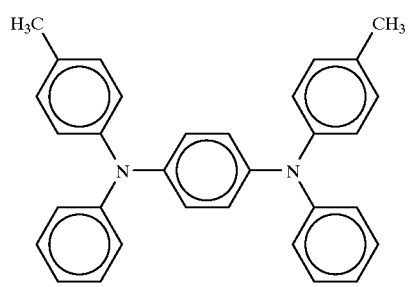
HTM-9
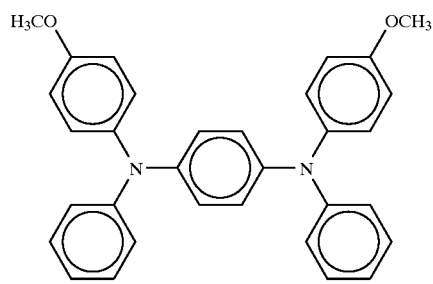
HTM-10

-continued
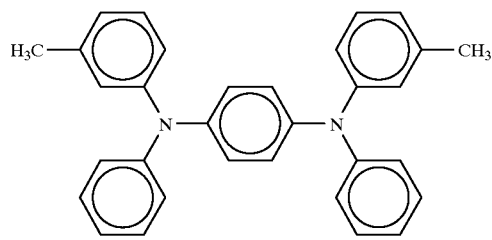
HTM-11
H₂-Phthalocyanine
HTM-12
Cu-Phthalocyanine
HTM-13
The following conventionally known compounds can be used as the luminescent materials in the organic EL element of the present invention:
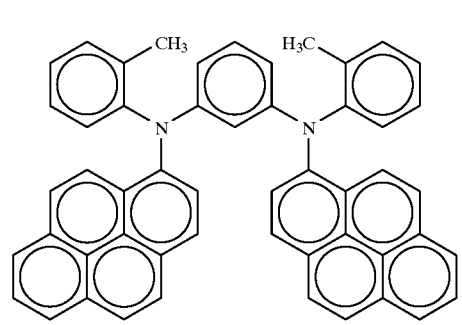
EM-1
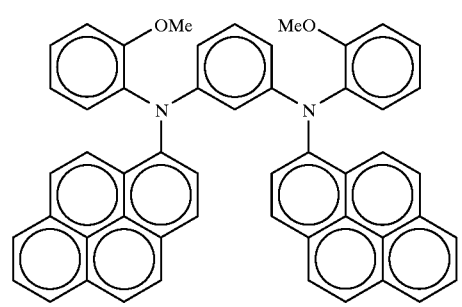
EM-2
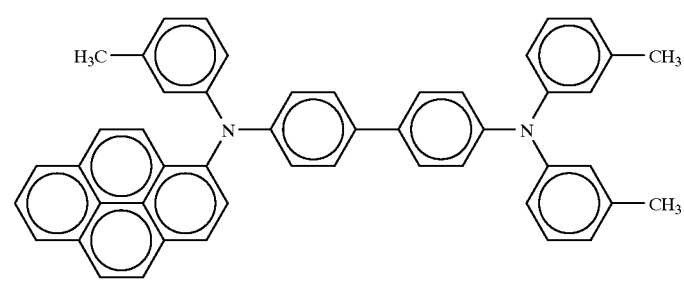
EM-3

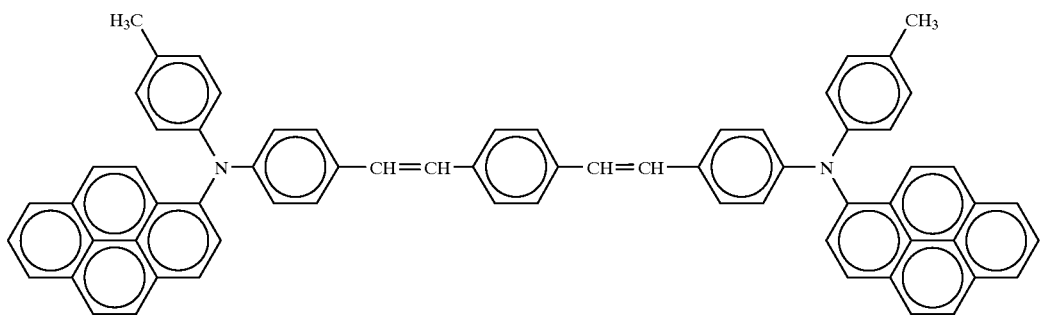

EM-4

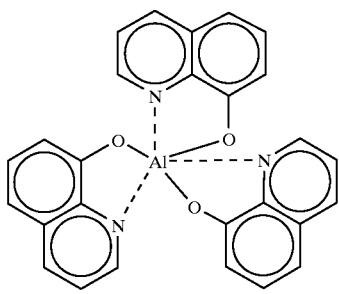

EM-5

Furthermore conventional dyes for use in dye laser, and materials with high fluorescence efficiency such as a quinacridone compound, a naphthalimide compound and a peryleneimide compound may be used as the luminescent materials. In the case where the film-forming properties of such a luminescent material are poor, a film may be formed using another appropriate material to which the luminescent material with poor film-forming properties is doped.

Conventional electron-transporting materials, preferably luminescent electron-transporting materials can be used in combination with the previously mentioned oxadiazole compound of formula (I) and/or (II) in order to improve the electron-injecting properties from the cathode and the electron-transporting properties. For example, a metal chelate complex compound with good film-forming properties such as tris(8-hydroxyquinolinato) aluminum can be used together with the oxadiazole compound of formula (I) or (II) as the electron-transporting material.

To be more specific, chelate compounds of a metal such as Al, Ga, Be, Mg or Zn, and any of the following ligands can be employed as the electron-transporting materials:

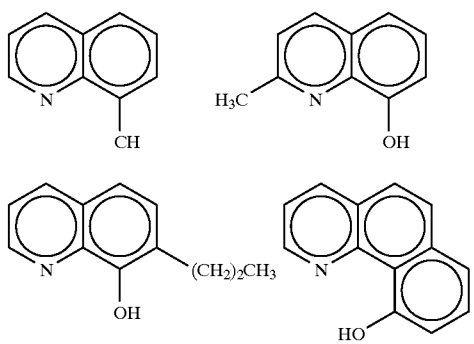

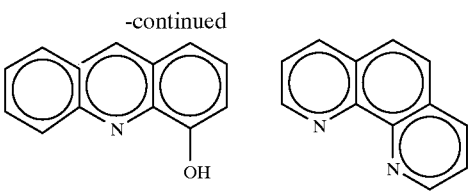

The organic EL element according to the present invention employs the oxadiazole compound of formula (I) as the electron-transporting material, as previously mentioned In particulars the following oxadiazole compound of formula (I)-1 is effective:

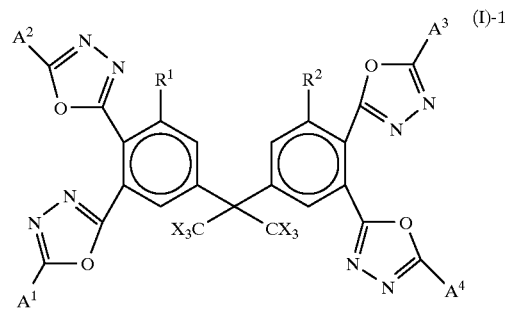

(I)-1 wherein $A^1$ to $A^4$ are each independently an aromatic hydrocarbon group which may have a substituent, or an aromatic heterocyclic group which may have a substituent; X is a hydrogen atom or a fluorine atom, and $R^1$ and $R^2$ are each independently a hydrogen atom, a halogen atom, or an alkyl group having 1 to 12 carbon atoms which may have a substituent, or an alkoxyl group having 1 to 12 carbon atoms which may have a substituent.

The above-mentioned oxadiazole compound of formula (I)-1 can be produced by allowing an acid chloride compound of formula (III) to react with a tetrazole compound of formula (IV) or (V):

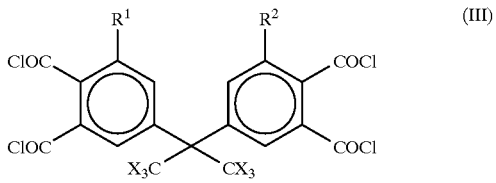

wherein X is a hydrogen atom or a fluorine atom; and R$^1$ and R$^2$ are each independently a hydrogen atom, a halogen atom, an alkyl group having 1 to 12 carbon atoms which may have a substituent, or an alkoxyl group having 1 to 12 carbon atoms which may have a substituent; and

or

wherein A is an aromatic hydrocarbon group which may have a substituent, or an aromatic heterocyclic group which may have a substituent, and A is corresponding to each of A$^1$ to A$^4$ in formula (I)-1.

The above-mentioned tetrazole compounds of formulae (IV) and (V) are tautomers, so that they are changeable to each other and generally present as a mixture. Such a mixture of the tautomers (IV) and (V) can be used for the synthesis of the oxadiazole compound of formula (I)-1.

The tetrazole compound of formula (IV) or (V) can be proposed by the conventional method, for example, by a synthesis method as described in "Synthesis 71 (1973)". The reaction between the acid chloride compound of formula (III) and the tetrazole compound of formula (IV) or (V) may be carried out in accordance with the oxadiazole synthesis method proposed by R. D. Huisgen, et al., for example by the method as stated in "Angew. Chem., 72, 366 (1960)", "Chem. Ber., 93, 2106 (1960)", "Tetrahedron, 11, 241 (1960)", or "Chem. Ber., 98, 2966 (1965)".

The acid chloride compound of formula (III) serving as an intermediate for producing the oxadiazole compound of formula (I)-1 can be prepared by treating an acid anhydride compound of formula (VI) with a halogenating agent:

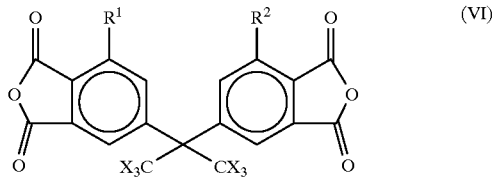

wherein X is a hydrogen atom or a fluorine atom; and R$^1$ and R$^2$ are each independently a hydrogen atom, a halogen atom, an alkyl group having 1 to 12 carbon atoms which may have a substituent, or an alkoxyl group having 1 to 12 carbon atoms which may have a substituent.

As the halogenating agent used in the preparation of the acid chloride compound of formula (III), phosphorus pentachloride and phosgene can be employed.

Other features of this invention will become apparent in the course of the following description of exemplary embodiments which are given for illustration of the invention and are not intended to be limiting thereof.

Synthesis Example 1—1

[Synthesis of 4,4'-(hexafluoroisopropylidene)diphthaloyl acid chloride]

A mixture of 10 g of 4,4'-(hexafluoroisopropylidene) diphthalic anhydride, 10.5 g of phosphorus pentachloride, and 6 ml of phosphorus oxychloride was placed in a flask, and the mixture was refluxed for 25 hours under the application of heat thereto, so that the mixture was turned into a solution. Thereafter, phosphorus oxychloride generated by the reaction and unreacted phosphorus pentachloride were distilled away. With the addition of 30 ml of dichloromethane to the reaction mixture, an insoluble matter was removed by filtration and the solvent was distilled away from the reaction mixture, so that 11 g of a desired material was obtained as a crude oily product.

Thereafter the above obtained crude material was dissolved in 30 ml of cyclohexane with the application of heat thereto. The mixture was allowed to stand with the addition of 50 ml of n-hexane thereto, and then a resultant oily precipitate was taken out by decantation, washed with n-hexane, and dried. Thus, a desired material with the following formula was obtained in a yield of 6.8 g (55%).

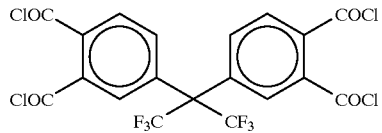

This material was a colorless oily product, and the infrared spectrum of this product was measured by applying the product to a transparent NaCl single crystal tablet. As a result, absorptions arising from carbon-oxygen stretching vibrations of an acid chloride occurred at 1790 cm$^{-1}$ and 1745 cm$^{-1}$.

Synthesis Example 2—1

[Synthesis of oxadiazole compound No. 11]

A mixture of 4.023 g of the 4,4'-(hexafluoroisopropylidene)diphthalic acid chloride obtained in Synthesis Example 1—1, 7.31 g of 5-phenyl-1H-tetrazole, and 45 ml of dehydrated pyridine serving as a solvent was placed in a flask and refluxed for 45 hours under the application of heat thereto. The mixture was then cooled to room temperature, and 160 ml of water was added thereto A resulting precipitate was taken out by filtration, and washed with waters so that 3.7 g of a desired material was obtained as a crude product.

Then, the crude product was purified by subjecting to the column chromatography once using as a developing solvent a mixture of chloroform and tetrahydrofuran with a volume ratio of 19:1 and successively subjecting to the column chromatography twice using as a developing solvent a mixture of chloroform and tetrahydrofuran with a volume ratio of 33:1. Thus, a desired product was obtained in a yield of 2.5 g (34%). This product was colorless, and the melting point of the product recrystallized from a mixed solvent of cyclohexane and toluene with a volume ratio of 1:1 was 133° C. The glass transition temperature of the product was 100.3° C.

Figure 7:
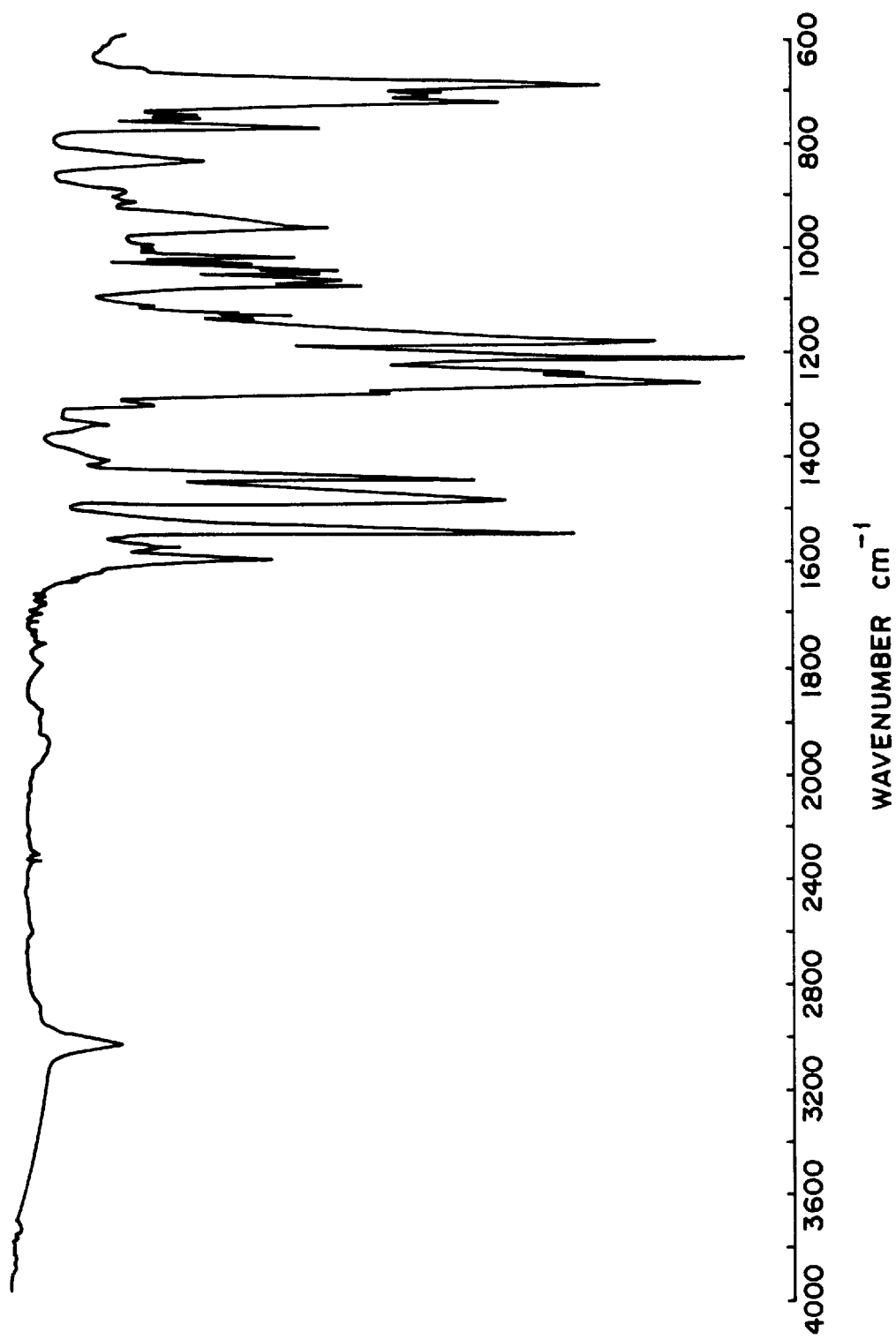
FIG. 7 is an IR spectrum of an oxadiazole compound No. 11 for use in the present invention, taken by use of a KBr tablet.

FIG. 7 shows an infrared spectrum of the obtained product by use of a KBr tablet.

The results of the elemental analysis of the obtained product were as follows:

|  | % C | % H | % N |
|---|---|---|---|
| Calculated | 64.09 | 2.98 | 12.72 |
| Found | 63.89 | 3.14 | 12.69 |

The calculation is based on the formula for $C_{47}H_{26}F_6N_8O_4$.

The obtained product was identified as the oxadiazole compound No. 11 as shown in Table 1 through the above results.

Synthesis Example 2—2

[Synthesis of oxadiazole compound No. 14]

A mixture of 1.32 g of the 4,4'-(hexafluoroisopropylidene)diphthalic acid chloride obtained in Synthesis Example —1, 3.18 g of 5-(biphenyl-4-yl)-1H-tetrazole, and 30 ml of dehydrated pyridine serving as a solvent was placed in a flask and refluxed for 45 hours under the application of heat thereto. The mixture was then cooled to room temperature, and 70 ml of methanol was added thereto. A resulting precipitate was taken out by filtration, and washed with methanol, so that 0.59 g of a desired material was obtained as a crude product.

Then, the crude product was purified by subjecting to the column chromatography twice using as a developing solvent a mixture of chloroform and tetrahydrofuran with a volume ratio of 19:1, and successively subjecting to the column chromatography once using as a developing solvent a mixture of chloroform and tetrahydrofuran with a volume ratio of 33:1. Thus, a desired product was obtained in a yield of 0.51 g (18%). This product was colorless, and the product recrystallized from a mixed solvent of cyclohexane and toluene with a volume ratio of 1:1 did not clearly show the melting point. The glass transition temperature of the product was 130.7° C.

Figure 8:
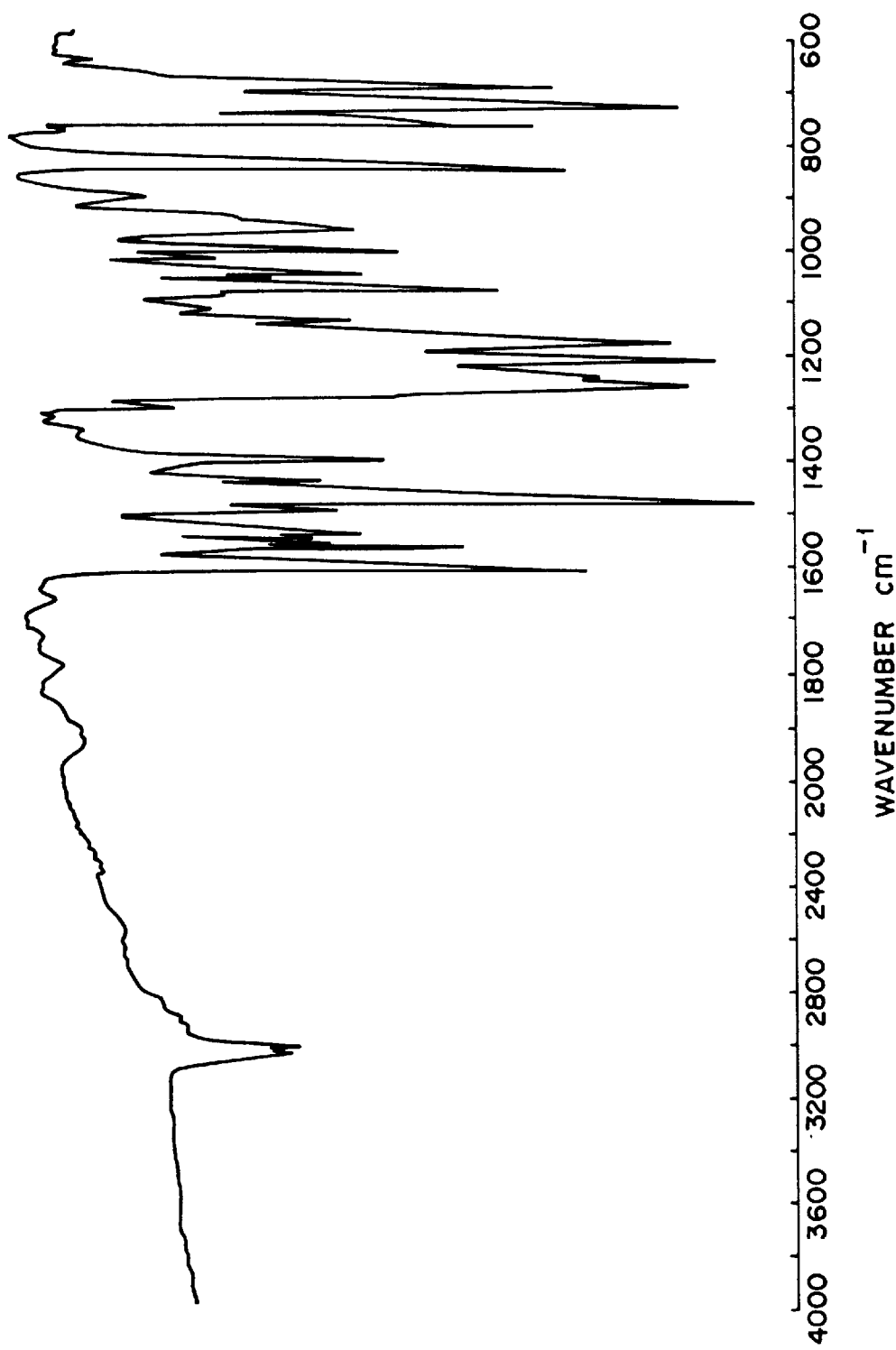
FIG. 8 is an IR spectrum of an oxadiazole compound No. 14 for use in the present invention, taken by use of a KBr tablet.

FIG. 8 shows an infrared spectrum of the obtained product by use of a KBr tablet.

The results of the elemental analysis of the obtained product were as follows:

|  | % C | % H | % N |
|---|---|---|---|
| Calculated | 71.96 | 3.57 | 9.45 |
| Found | 71.84 | 3.77 | 9.30 |

The calculation is based on the formula for $C_{71}H_{42}F_6N_8O_4$.

The obtained product was identified as the oxadiazole compound No. 14 as shown in Table 1 through the above results.

Synthesis Example 2—3

[Synthesis of oxadiazole compound No. 18]

A mixture of 1.29 g of the 4,4'-(hexafluoroisopropylidene)diphthalic acid chloride obtained in Synthesis Example 1—1, 2.28 g of 5-(naphthyl-2-yl)-1H-tetrazole, and 30 ml of dehydrated pyridine serving as a solvent was placed in a flask and refluxed for 73 hours under the application of heat thereto. The mixture was cooled to room temperature, and then evaporated to dryness, so that 3.77 g of a desired material was obtained as a crude product.

Then, the crude product was purified by subjecting to the column chromatography once using as a developing solvent a mixture of chloroform and tetrahydrofuran with a volume ratio of 19:1, and successively subjecting to the column chromatography twice using as a developing solvent a mixture of chloroform and tetrahydrofuran with a volume ratio of 33:1. Thus, a desired product was obtained in a yield of 0.67 g (27%). This product was colorless, and the product recrystallized-from a mixed solvent of cyclohexane and toluene with a volume ratio of 1:1 did not clearly show the melting point. The glass transition temperature of the product was 117.9° C.

Figure 9:
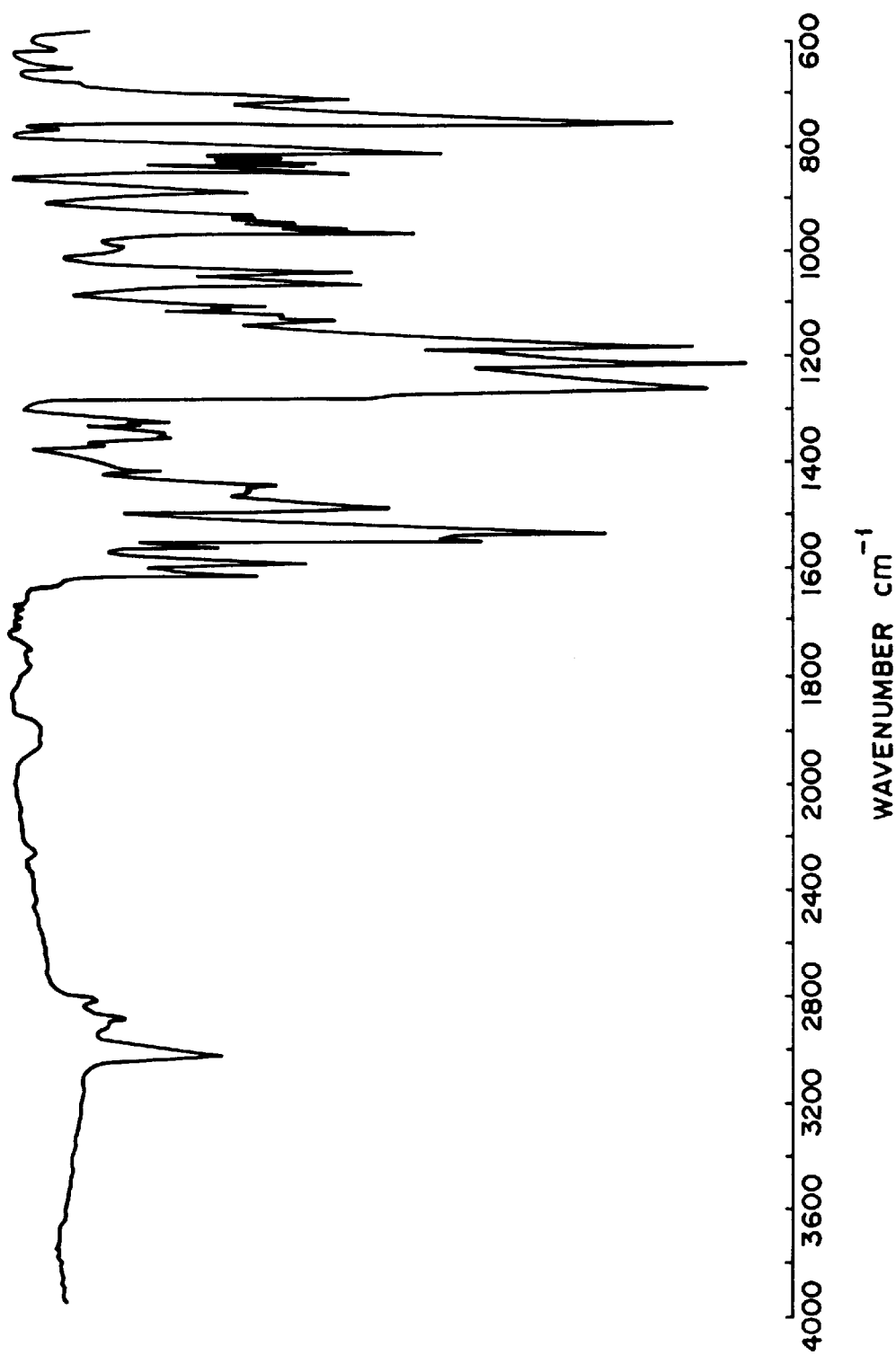
FIG. 9 is an IR spectrum of an oxadiazole compound No. 18 for use in the present invention, taken by use of a KBr tablet.

FIG. 9 shows an infrared spectrum of the obtained product by use of a KBr tablet.

The results of the elemental analysis of the obtained product were as follows:

|  | % C | % H | % N |
|---|---|---|---|
| Calculated | 69.87 | 3.35 | 10.35 |
| Found | 69.85 | 3.40 | 10.12 |

The calculation is based on the formula for $C_{63}H_{36}F_6N_8O_4$.

The obtained product was identified as the oxadiazole compound No. 18 as shown in Table 1 through the above results.

Each of the above obtained oxadiazole compounds Nos. 11, 14 and 18 for use in the present invention and the following comparative oxadiazole compounds (A) to (D) was deposited on a glass plate by vacuum deposition to form a thin film with a thickness of 500 nm.

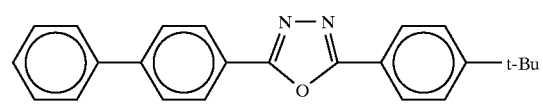
(A)

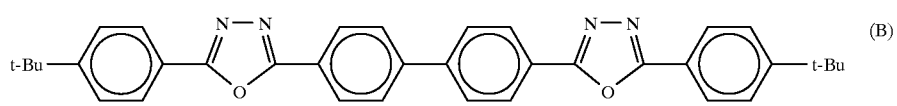
(B)

-continued

(C)

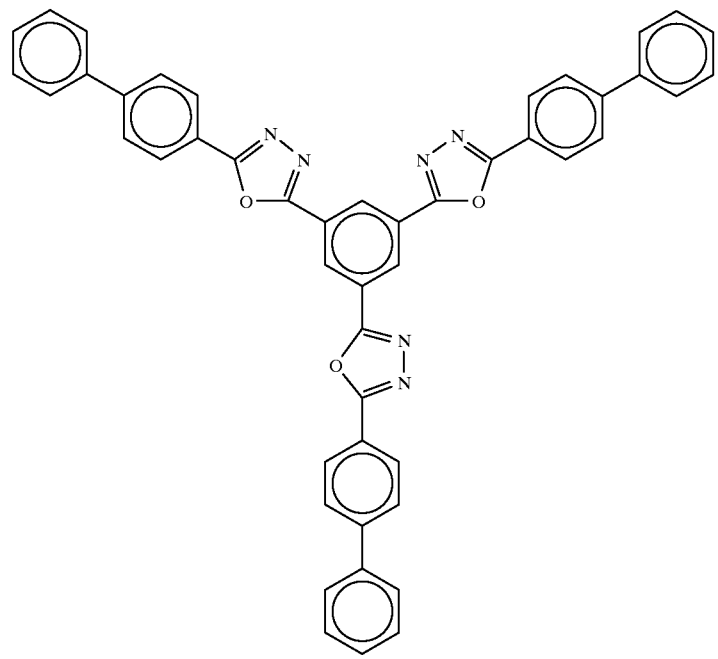

(D)

Each thin film thus deposited on the glass plate was observed visually or using an electron microscope immediately after the formation of the film and after the film was allowed to stand for 6 months at room temperature.

As a result, the films of the comparative oxadiazole compounds (A) and (B) were originally crystalline films. After the storage of the films, they became white opaque to a high degree. The films of the comparative oxadiazole compounds (C) and (D) assumed uniform amorphous state immediately after the deposition on the glass plate. However, those films crystallized and became white opaque after the storage thereof.

In contrast to this, any deposited films of the oxadiazole compounds Nos. 11, 14 and 18 were originally amorphous, and the observation by the electron microscope confirmed that those transparent uniform amorphous films were maintained as they were after the storage thereof.

EXAMPLE 1

An $SiO_2$ layer was provided on a glass plate as an undercoat layer for an anode. Then, indium-tin-oxide (ITO) was deposited on the $SiO_2$ layer by sputtering, so that an anode with a surface resistance of 15 $\Omega/\square$ was provided.

The surface of the anode thus obtained was successively washed with a neutral detergent, an oxygen-containing cleaning agent and isopropyl alcohol. Then, the glass plate bearing the ITO anode thereon was placed in an apparatus for vacuum deposition, which was evacuated up to the degree of vacuum of $1\times10^{-4}$ Pa. The vacuum-deposition was successively carried out in such a fashion that the temperature of the glass plate and the ITO anode was maintained at room temperature.

The previously mentioned hole-transporting compound HTM-1 was vacuum-deposited on the ITO anode so that a hole-transporting layer with a thickness of 40 nm was provided on the anode.

Next, the previously mentioned luminescent compound EM-1 was vacuum-deposited on the above prepared hole-transporting layer, so that a luminescent layer with a thickness of 15 nm was provided on the hole-transporting layer.

Then, the oxadiazole compound No. 11 as shown in Table 2 was vacuum-deposited on the above prepared luminescent layer, so that a second electron-transporting layer with a thickness of 20 nm was provided on the luminescent layer. Thereafter, tris(8-hydroxyquinolinato) aluminum was vacuum-deposited on the above prepared second electron-transporting layer, so that a first electron-transporting layer with a thickness of 30 nm was provided on the second electron-transporting layer.

Finally, Mg and Ag were vacuum-deposited with a deposition speed ratio of 10:1 on the above prepared first electron-transporting layers with a mask of an electrode pattern being disposed on the first electron-transporting layer, so that a cathode made of an alloy of Mg and Ag with a thickness of 200 nm was provided on the first electron-transporting layer. Thus, an EL element No. 1 according to the present invention, having a luminescent area of 2 mm×2 mm was obtained. In the above prepared EL element No. 1 of the present invention, the hole can be inhibited from transporting toward the cathode owing to the second electron-transporting layer of the oxadiazole compound No. 11, thereby preventing the tris(8-hydroxyquinolinato) aluminum for use in the first electron-transporting layer from becoming luminous.

The anode and the cathode of the EL element No. 1 were connected with a direct-current power source via a lead wire. When a d.c. voltage of 9.6 V was applied to the EL element, an electric current of 30 mA was flowing per unit area of one square centimeter. At that time, a peak wavelength of the emission spectrum of the EL element No. 1 was 500 nm, and the luminance was 280 cd/m$^2$. Thereafter, the EL element was continuously caused to assume a luminous state for 3 hours. The luminance of the EL element after 3 hours was 50% or more the initial luminance.

Furthermore, after the EL element No. 1 was stored at 80° C for 24 hours, the EL element was driven to assume a luminous state. The emission properties of the EL element were similar to those obtained before the storage, and any change such as crystallization did not take place in the second electron-transporting layer of the oxadiazole compound No. 11.

EXAMPLE 2

The procedure for preparation of the organic EL element No. 1 in Example 1 was repeated except that the oxadiazole compound No. 11 for use in the second electron-transporting layer in Example 1 was replaced by the oxadiazole compound No. 14 as shown in Table 1, so that an EL element No. 2 according to the present invention was obtained.

The anode and the cathode of the EL element No. 2 were connected with a direct-current power source via a lead wire and a direct voltage was applied to the EL element in the same manner as in Example 1. When a d.c. voltage of 9.0 V was applied to the EL element, an electric current of 30 mA was flowing per unit area of one square centimeter. At that time, a peak wavelength of the emission spectrum of the EL element No. 2 was 500 nm, and the luminance was 120 cd/m$^2$. Thereafter, the EL element was continuously caused to assume a luminous state for 3 hours. The luminance of the element after 3 hours was 50% or more the initial luminance.

Furthermore, after the EL element No. 2 was stored at 80° C for 24 hours, the EL element was driven to assume a luminous state. The emission properties of the EL element were similar to those obtained before the storage and the second electron-transporting layer of the oxadiazole compound No. 14 did not deteriorate.

EXAMPLE 3

The procedure for preparation of the organic EL element No. 1 in Example 1 was repeated except that the oxadiazole compound No. 11 for use in the second electron-transporting layer in Example 1 was replaced by the oxadiazole compound No. 18 as shown in Table 1 so that an EL element No. 3 according to the present invention was obtained.

The EL element No. 3 was continuously driven by a constant-current direct-current power source with a current density of 30 mA/cm$^2$. The initial luminance of the EL element No. 3 was 60 cd/m$^2$, and the luminance of the EL element after 100 hours was 50% or more the initial luminance.

Furthermore, after the EL element No. 3 was stored at 80° C for 24 hours, the EL element was driven to assume a luminous state. The emission properties of the EL element were similar to those obtained before the storage.

EXAMPLE 4

The procedure for preparation of the organic EL element No. 1 in Example 1 was repeated except that the oxadiazole compound No. 11 for use in the second electron-transporting layer in Example 1 was replaced by the oxadiazole compound No. 21 as shown in Table 2, so that an EL element No. 4 according to the present invention was obtained.

The EL element No. 4 was driven by a direct-current pulse power source so as to repeatedly turn the EL element on and off at intervals of 10 msec under the conditions that the current density was 30 mA/cm$^2$ and the duty ratio was 50% when a voltage was applied to the EL element.

The initial luminance of the EL element No. 4 was 300 cd/m$^2$, and the luminance of the EL element obtained after it was continuously driven for 3 hours was 50% or more the initial luminance.

EXAMPLE 5

The procedure for preparation of the organic EL element No. 1 in Example 1 was repeated except that the oxadiazole compound No. 11 for use in the second electron-transporting layer in Example 1 was replaced by the oxadiazole compound No. 42 as shown in Table 2, so that an EL element No. 5 according to the present invention was obtained.

The EL element No. 5 was driven by the same method as in Example 4. The initial luminance of the EL element No. 5 was 150 cd/m$^2$, and the luminance of the EL element obtained after it was continuously driven for 3 hours was 50% or more the initial luminance.

EXAMPLE 6

The procedure for preparation of the organic EL element No. 1 in Example 1 was repeated except that the oxadiazole compound No. 11 for use in the second electron-transporting layer in Example 1 was replaced by the oxadiazole compound No. 46 as shown in Table 2, so that an EL element No. 6 according to the present invention was obtained.

The EL element No. 6 was driven by the same method as in Example 4. The initial luminance of the EL element No. 6 was 190 cd/m$^2$, and the luminance of the EL element obtained after it was continuously driven for 50 hours was 50% or more the initial luminance.

EXAMPLE 7

A 2 mm×2 mm anode made of indium-tin-oxide (ITO) with a surface resistance of 15 Ω/□ was provided on a glass plate.

Then, the glass plate bearing the anode thereon was placed in an apparatus for vacuum deposition, which was evacuated up to the degree of vacuum of 1.33×10$^{-4}$ Pa. The vacuum-deposition was carried out in such a fashion that the temperature of the glass plate and the ITO anode was maintained at room temperature.

The previously mentioned hole-transporting compound HTM-1 was vacuum-deposited on the ITO anode, so that a hole-transporting layer with a thickness of 40 nm was provided on the anode.

Next, the luminescent compound EM-1 was vacuum-deposited on the above prepared hole-transporting layer, so that a luminescent layer with a thickness of 15 nm was provided on the hole-transporting layer.

Then, the oxadiazole compound No. 11 as shown in Table 1 was vacuum-deposited on the above prepared luminescent layers so that an electron-transporting layer with a thickness of 40 nm was provided on the luminescent layer.

Finally, Mg and Ag were vacuum-deposited with a deposition speed ratio of 10:1 on the above prepared electron-transporting layer, so that a cathode made of an alloy of Mg and Ag with a thickness of 200 nm was provided on the electron-transporting layer. Thus, an EL element No. 7 according to the present invention was obtained.

The anode and the cathode of the EL element No. 7 were connected with a direct-current power source via a lead wire. When a d.c. voltage of 9 V was applied to the EL elements an electric current of 30 mA was flowing per unit area of one square centimeter. The luminescence of a blue-white color was clearly observed for a long period of time.

Furthermore, after the EL element No. 7 was stored for 3 months, luminescence was clearly observed.

COMPARATIVE EXAMPLE 1

The procedure for preparation of the organic EL element No. 1 in Example 1 was repeated except that the oxadiazole compound No. 11 for use in the second electron-transporting layer in Example 1 was replaced by the comparative oxadiazole compound of formula (A), so that a comparative EL element No. 1 was obtained.

The electrodes of the comparative EL element No. 1 were connected with a constant-current direct-current power sources and the EL element was continuously driven for 3 hours with a current density of 30 mA/cm$^2$. The initial luminance of the comparative EL element No. 1 was 380 cd/m$^2$, but the luminance of the EL element measured after 3 hours was 10% or less the initial luminance.

COMPARATIVE EXAMPLE 2

The procedure for preparation of the organic EL element No. 1 in Example 1 was repeated except that the oxadiazole compound No. 11 for use in the second electron-transporting layer in Example 1 was replaced by a comparative oxadiazole compound of the following formula (E), so that a comparative EL element No. 2 was obtained.

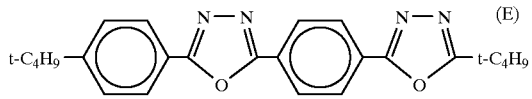

The electrodes of the comparative EL element No. 2 were connected with a constant-current direct-current power sources and the EL element was continuously driven for 3 hours with a current density of 30 mA/cm$^2$. The initial luminance of the comparative EL element No. 2 was 400 cd/m$^2$, but the luminance of the EL element measured after 3 hours was 10% or less the initial luminance.

COMPARATIVE EXAMPLE 3

The procedure for preparation of the organic EL element No. 1 in Example 1 was repeated except that the oxadiazole compound No. 11 for use in the second electron-transporting layer in Example 1 was replaced by a comparative oxadiazole compound of the following formula (F), so that a comparative EL element No. 3 was obtained.

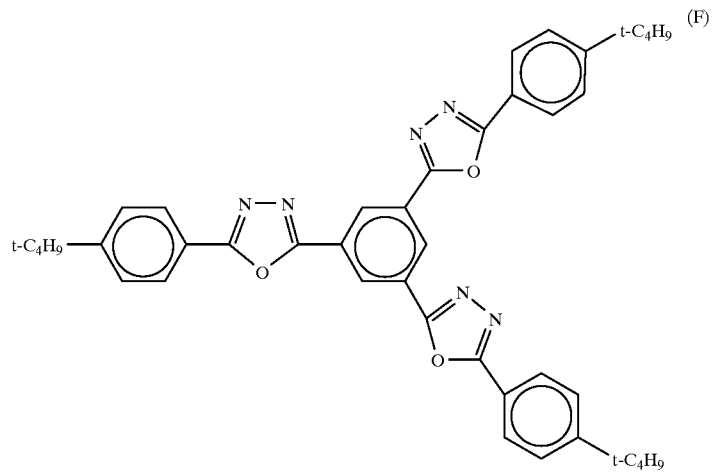

The electrodes of the comparative EL element No. 3 were connected with a constant-current direct-current power source, and the EL element was continuously driven for 3 hours with a current density of 30 mA/cm$^2$. The initial luminance of the comparative EL element No. 3 was 350 cd/m$^2$, but the luminance of the EL element measured after 3 hours was 30% or less the initial luminance.

As previously explained, the organic EL element of the present invention comprises the oxadiazole compound of formula (I) or (II) as an electron-transporting material, which has excellent thin-film stability, so that a variety of luminescent materials capable of emitting lights of different colors can be selected for the EL element. In addition, the decrease of the luminance of the EL element can be minimized when the EL element of the present invention is continuously driven. It is therefore considered that the durability of the EL element of the present invention is remarkably high.

Furthermore, the oxadiazole compound for use in the present invention can be easily formed into an amorphous film by deposition or solution coating method, and the film thus obtained is very stable and hardly crystallizes during the storage thereof. The oxadiazole compound for use in the present invention is therefore regarded as a very useful material for use in the organic EL element with high reliability.

Japanese Patent Application No. 07-74715 filed Mar. 8, 1995, and Japanese Patent Application No. 05-345383 filed Dec. 21, 1993 are hereby incorporated by reference.

What is claimed is:

1. An organic electroluminescent element comprising an anode, a cathode, and an organic compound layer provided between said anode and said cathode, said organic compound layer comprising an oxadiazole compound of formula (II) in an effective amount:

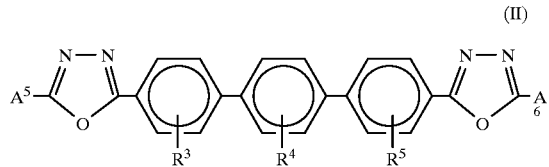

wherein $A^5$ and $A^6$ are each independently an aromatic hydrocarbon group which may have a substituent, or an aromatic heterocyclic group which may have a substituent; and $R^3$, $R^4$ and $R^5$ are each independently a hydrogen atom, a halogen atom, an alkyl group having 1 to 12 carbon atoms which may have a substituent, an alkoxyl group having 1 to 12 carbon atoms which may have a substituent, or hydroxyl group.

2. The organic electroluminescent element as claimed in claim 1, wherein said organic compound layer comprise a plurality of overlaid organic compound sub-layers which comprise a luminescent layer and at least one electron-transporting layer comprising said oxadiazole compound of formula (II), which is provided between said luminescent layer and said cathode.

* * * * *

UNITED STATES PATENT AND TRADEMARK OFFICE
CERTIFICATE OF CORRECTION

PATENT NO.   :   5,932,362
DATED:       :   August 3, 1999
INVENTOR(S)  :   Kazukiyo NAGAI et al It is certified that error appears in the above-identified patent and that said Letters patent is hereby corrected as shown below:

Column 15, line 47, "layers" should read --layer--;

line 60, "examples" should read --example,--.

Column 24, line 41, "mentioned" should read --mentioned.--.

Column 32, line 63, "layers" should read --layer--.

Column 33, line 44, "sources" should read --source--.

Signed and Sealed this

Third Day of October, 2000

Attest:

Q. TODD DICKINSON

*Attesting Officer*          *Director of Patents and Trademarks*